US011403228B2

(12) United States Patent
Tanpairoj et al.

(10) Patent No.: US 11,403,228 B2
(45) Date of Patent: Aug. 2, 2022

(54) MEMORY DEVICE PAGE PROGRAM SEQUENCE

(71) Applicant: Micron Technology, Inc., Boise, ID (US)

(72) Inventors: Kulachet Tanpairoj, Santa Clara, CA (US); Jianmin Huang, San Carlos, CA (US); Tomoko Ogura Iwasaki, San Jose, CA (US); Kishore Kumar Muchherla, Fremont, CA (US); Peter Sean Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 16/998,631

(22) Filed: Aug. 20, 2020

(65) Prior Publication Data

US 2021/0255960 A1 Aug. 19, 2021

Related U.S. Application Data

(60) Provisional application No. 62/978,046, filed on Feb. 18, 2020.

(51) Int. Cl.

| G06F 3/06 | (2006.01) |
|---|---|
| G06F 12/0882 | (2016.01) |
| G11C 16/10 | (2006.01) |
| G11C 16/04 | (2006.01) |
| G06F 12/0811 | (2016.01) |
| G11C 29/00 | (2006.01) |
| G11C 16/26 | (2006.01) |
| G11C 16/08 | (2006.01) |

(52) U.S. Cl.
CPC ...... *G06F 12/0882* (2013.01); *G06F 12/0811* (2013.01); *G11C 16/08* (2013.01); *G11C 16/10* (2013.01); *G11C 16/26* (2013.01); *G11C 29/78* (2013.01)

(58) Field of Classification Search
CPC ......... G11C 16/08; G11C 16/10; G11C 16/26; G11C 29/78; G06F 12/0882; G06F 12/0811
USPC .......................................................... 711/154
See application file for complete search history.

(56) References Cited

U.S. PATENT DOCUMENTS

| 10,579,306 | B1* | 3/2020 | Huang | G06F 3/0679 |
|---|---|---|---|---|
| 2007/0242524 | A1* | 10/2007 | Hemink | G11C 16/0483 |
| | | | | 365/185.28 |
| 2008/0158950 | A1* | 7/2008 | Aritome | G11C 11/5628 |
| | | | | 365/185.03 |
| 2008/0225589 | A1* | 9/2008 | Aritome | G11C 16/10 |
| | | | | 365/185.03 |
| 2009/0237999 | A1* | 9/2009 | Li | G11C 11/5628 |
| | | | | 365/185.12 |
| 2012/0020154 | A1* | 1/2012 | Namiki | G11C 16/10 |
| | | | | 365/185.03 |
| 2020/0075111 | A1* | 3/2020 | Sheperek | G11C 16/10 |

(Continued)

*Primary Examiner* — Ly D Pham
(74) *Attorney, Agent, or Firm* — Schwegman Lundberg & Woessner, P.A.

(57) ABSTRACT

Various embodiments described herein provide for a page program sequence for a block of a memory device, such as a negative-and (NAND)-type memory device, where all the wordlines are programmed with respect to a given set of page types (e.g., LP pages) prior to wordlines are programmed with respect to a next set of page types (e.g., UP and XP pages).

20 Claims, 7 Drawing Sheets

(56) References Cited

U.S. PATENT DOCUMENTS

| | | | |
|---|---|---|---|
| 2020/0075120 A1* | 3/2020 | Sheperek | G11C 29/021 |
| 2020/0081655 A1* | 3/2020 | Hsiao | G06F 3/0679 |
| 2020/0234780 A1* | 7/2020 | Papandreou | G11C 16/26 |
| 2021/0019208 A1* | 1/2021 | Sheperek | G11C 16/10 |
| 2021/0240635 A1* | 8/2021 | Wu | G06F 3/0673 |
| 2021/0255960 A1* | 8/2021 | Tanpairoj | G11C 29/78 |

* cited by examiner

MEMORY DEVICE PAGE PROGRAM SEQUENCE

CROSS-REFERENCE TO RELATED APPLICATION

This application claims priority to and the benefit of U.S. Provisional Patent Application No. 62/978,046, filed on Feb. 18, 2020, which is incorporated herein by reference.

TECHNICAL FIELD

Embodiments of the disclosure relate generally to memory devices, and more specifically, relate to a sequence for programming one or more pages of a memory device, such as a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
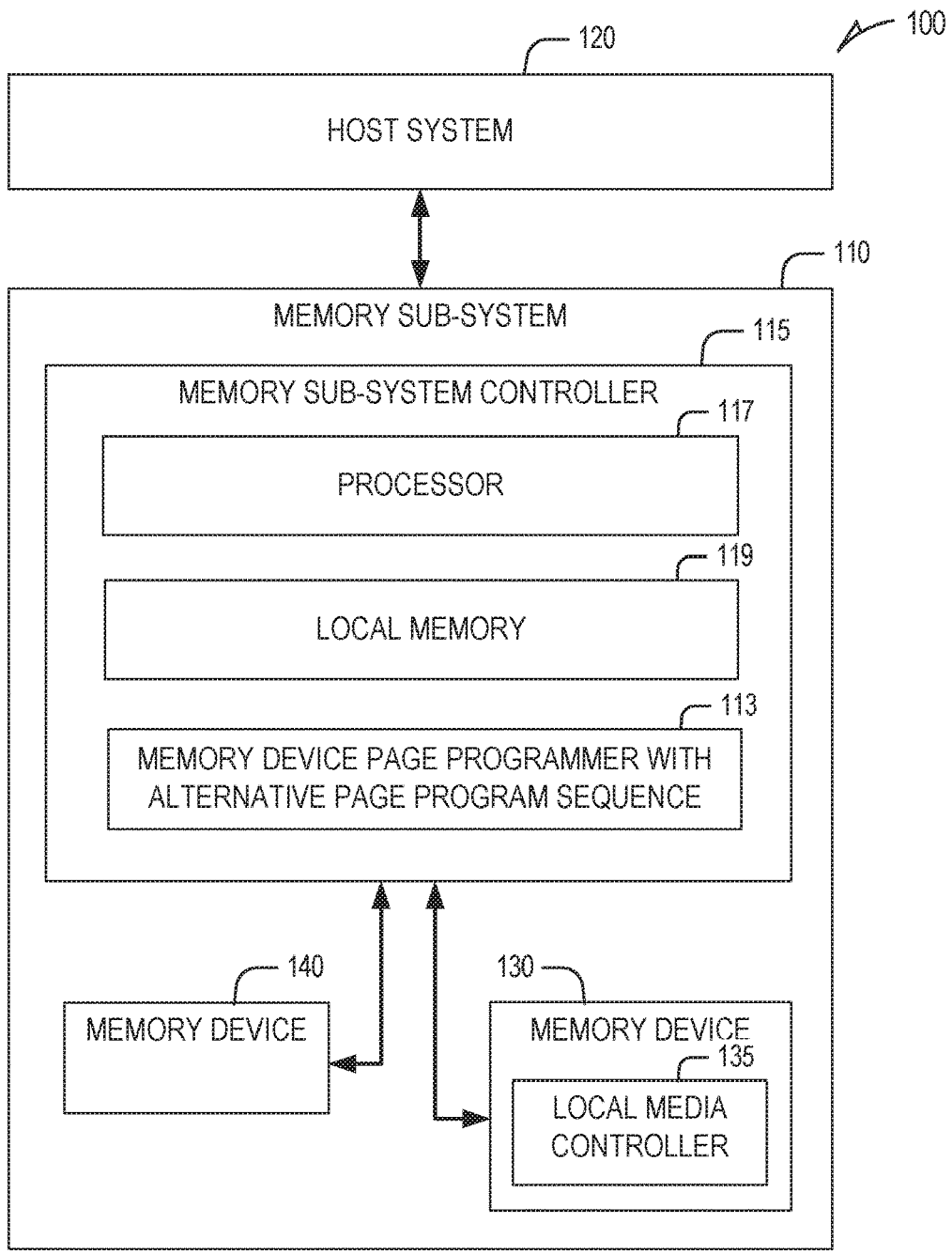
FIG. 1 illustrates an example computing system that includes a memory sub-system in accordance with some embodiments of the present disclosure.

Aspects of the present disclosure are directed to a sequence for programming one or more pages of a memory device, such as a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

A memory device can be a non-volatile memory device. A non-volatile memory device is a package of one or more die. Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

For certain memory devices, such as NAND-type memory devices, there are one or more blocks in a given memory device, multiple wordlines in a given block, multiple pages in a given wordline. Each page can store one or more data bits. Additionally, each page in a wordline can represent a different page type, such as lower page (LP) page type, an upper page (UP) page type, an extra page (XP) page type, and a top page (TP) page type of a NAND-type memory device (e.g., one comprising quad-level cells (QLCs)). As used herein, a page of LP page type can be referred to as a "LP page," a page of UP page type can be referred to as a "UP page," a page of XP page type can be referred to as a "XP page," a page of TP page type can be referred to as a "TP page." Each page type can represent a different level of a cell (e.g., QLC can have a first level for LPs, a second level for UPs, a third level for XPs, and a fourth level for TPs). To write data to a given page, the given page is programmed according to a page programming algorithm.

Conventional page programming algorithms follow a certain page program sequence to reduce (or otherwise remove) wordline coupling effects in a block, which can arise from programming certain types of pages together on a given wordline and which can impact final charge distributions in a block. For instance, the page program sequence of some conventional programming algorithms involves programming a small range of wordlines together as a group and, once the pages in that group are programmed, a next group of wordlines are selected and programmed. This can continue with the next group of wordlines being selected and programmed until the last wordline of a block. In doing so, wordline coupling effect in a block can be reduced or removed.

For certain data storage applications, the use of a conventional page programming algorithm (having a conventional page program sequence) can render the write speed of a memory device (e.g., NAND-type memory device) too slow for data write operations (e.g., memory device of a memory sub-system cannot keep up with the number of write operations requested by the memory sub-system controller). As such, some conventional memory devices make use of cache pages, such as one implemented using one or more single-level cell (SLC) pages of the memory device, to which host data is first written in order to improve the write speed of the memory device. SLC pages do not involve use of a page programming algorithm and generally have a faster write speed than multi-level cell (MLC) pages. With use of cache pages, data written to the cache pages (e.g., SLC pages) of a memory device will eventually be copied or moved to a non-cache pages of the memory device, such as non-cache pages implemented using one or more MLC pages of the memory device (e.g., triple-level cell (TLC) pages or quad-level cell (QLC) pages of the memory device). By using cache pages (e.g., a SLC pages) in this manner, a memory device that uses a conventional page program algorithm (to write to non-cache pages of the memory device) can improve its write speed over directly writing to non-cache pages of the memory device. Unfortunately, the process of copying/moving data from cache pages to non-cache pages of a memory device can involve determining (e.g., tracking) valid cache pages, reading data from cache pages (e.g., SLC pages in SLC blocks), erasing non-cache pages (e.g., MLC pages), and writing data from cache pages data to non-cache pages. Accordingly, the copying/moving process can be regarded as an inefficient use of available blocks, slowing down memory sub-system performance, and adding extra unnecessary writes of host data within the memory device. Extra, unnecessary writes within a memory device can increase memory device (e.g., NAND-type memory device) write amplification and can reduce the amount of data that the host can write to the memory device before blocks reach end-of-life (e.g., extra reads to copy data, extra writes (e.g., 100-200 MB), and the life of the memory device (e.g., NAND-type memory device) can expire faster).

Aspects of the present disclosure address the above and other deficiencies by programming pages of a block of a memory device using a page program sequence that is different from conventional program sequences. According to some embodiments, with respective to a particular block of a memory device, the page program sequence comprises programming (with data) all the wordlines with respect to a given set of page types (e.g., LP pages) before programming (with data) wordlines with respect to a next set of page types (e.g., UP and XP pages). This page program sequence can continue in this way (as more data is written to the particular block) until all sets of page types are programmed in this manner. Such a page program sequence can be used with a memory device that comprises a NAND-type memory device implemented using one or more replacement gate (RGs). RG-based NAND-type memory devices generally experience less wordline coupling issues than a float gate (FG)-based NAND-type memory device.

For instance, where the memory device comprises a NAND-type memory device having QLC memory cells (i.e., having QLC pages), the page program sequence of some embodiments comprises: first program one or more LP pages of wordlines of a given block; once LP pages of all wordlines of the given block are programmed, next program UP and XP pages of wordlines of the given block; and once XP and UP pages of all wordlines of the given block are programmed, next program TP pages of wordlines of the given block. In another instance, where the memory device comprises a NAND-type memory device having TLC memory cells (i.e., having TLC pages), the page program sequence of some embodiments comprises: first program one or more LP pages of wordlines of a given block; once LP pages of all wordlines of the given block are programmed, next program UP pages of wordlines of the given block; and once UP pages of all wordlines of the given block are programmed, next program TP pages of wordlines of the given block. For some embodiments, the programming of wordlines with respect to a given set of page types is such that a next wordline of pages are not programmed (with respect to the given set of page types) until all pages of the given set of page types are programmed for the current wordline. For instance, with respect to a NAND-type memory device having QLC memory cells, XP and UP pages of a next wordline are not programmed with data until both the XP and UP pages of the current wordline are programmed with data.

With respect a NAND-type memory device having MLC memory cells (e.g., TLC or QLC memory cells), some embodiments can use the page program sequence described herein to lower the program time (e.g., tPROG) of the NAND-type memory device such the LP pages of a given block can be used in place of SLC pages for write operations (e.g., use LP pages can be used in place of a separate cache implemented using SLC memory cells). Without use of a separate cache (e.g., SLC-based cache), after LP pages in a given block are full, various embodiments can program additional data to UP and XP pages, and eventually program additional data to TP pages, without having to move data from LP page or erasing MLC blocks. Additionally, for some embodiments, the LP pages of a block can be used as a primary write cache, and the XP and UP pages of the block can be used as a secondary write cache.

By improving the write speed of a memory device, various embodiments can obviate the need for using a separate cache (e.g., SLC-based cache) for write operations with respect to the memory device. By avoiding use of a separate cache, a memory device of some embodiments can avoid having to rewrite data (e.g., host data) that has already been written to the memory device (e.g., written to LP pages of a block), and can reduce additional erases (thereby increasing the amount of data that can be written to the memory device). For instance, by specifically avoiding use of a SLC-based cache, various embodiments can obviate the need to perform garbage collection with respect to SLC pages and MLC pages. Further, some embodiments described herein cam simplify processing device instructions (e.g., firmware) used to manage a memory device by only needing to tracking source page validity, since the processing device instruction no longer need to enable validity tracking of pages of a cache (e.g., SLC-based cache). Rather, the processing device instructions of some embodiments would only need to enable tracking validity of source pages.

Disclosed herein are some examples of systems for programming one or more pages of a memory sub-system (e.g., a NAND-type memory device), as described herein.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing environment 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system controller 115 includes a memory device page programmer with alternative page program sequence 113 (hereafter, the memory device page programmer 113) that enables or facilitates programming one or more pages of a block of a memory device (e.g., 130, 140) according to a page program sequence of some embodiments. For some embodiments, the memory device page programmer 113 enables the memory sob-system controller 115 to receive data (e.g., from the host system 120) to be written to at least one of the memory devices (e.g., 130, 140), and select a set of blocks of the at least one of the memory devices to which the data is to be written. For a particular block of the set of blocks, which comprises a plurality of wordlines and a plurality of page types (e.g., LP, UP, XP, and TP page types), the memory device page programmer 113 enables the memory sub-system controller 115 to write at least a portion of the data to the particular block. For some embodiments, the memory device page programmer 113 enables the memory sub-system controller 115 write the portion of data to the particular block by programming the particular block (with the portion of the data) according to a page program sequence described herein. For instance, the page program sequence can comprise: programming (with data) all the wordlines with respect to a first set of page types (e.g., LP pages) before programming wordlines with respect to a second set of page types (e.g., UP and XP pages); and programming (with data) all the wordlines with respect to the second set of page types (e.g., LP pages) before programming wordlines with respect to a third set of page types (e.g., TP pages). This page program sequence can continue in this way (as more data is written to the particular block) until all sets of page types are programmed in this manner. With respect to a memory device (e.g., 130, 140) comprising a NAND-type memory device having TLC memory cells, the first set of page types can comprise a LP page type, the second set of page types can comprise a UP page type, and the third set of page type can comprise a TP page type. With respect to a memory device (e.g., 130, 140) comprising a NAND-type memory device having QLC memory cells, the first set of page types can comprise a LP page type, the second set of page types can comprise UP and XP page types, and the third set of page type can comprise a TP page type.

As noted herein, operations enabled by the memory device page programmer 113 can be performed with respect to a memory device (e.g., 130, 140) that comprises a NAND-type memory device implemented using one or more replacement gate (RGs).

For some embodiments, the memory device page programmer 113 enables the memory sub-system controller 115 to write data to a memory device (e.g., 130, 140) without using a cache (e.g., SLC-base cache) of the memory device. For some embodiments, the memory device page programmer 113 enables the memory sub-system controller 115, by way of the page program sequence, to use the first set of page types (e.g., LP pages of blocks of the memory device 130 or 140) as a cache for performing write operations with respect to the memory device. Additionally, for some embodiments, the memory device page programmer 113 enables the memory sub-system controller 115, by way of the page program sequence, to use a first set of page types (e.g., LP pages of blocks of the memory device 130 or 140) as a first level (e.g., primary) cache for at least write operations, and a second set of page types (e.g., UP and XP pages of blocks of the memory device 130 or 140) as a second level (e.g., second) cache for performing write operations with respect to the memory device.

Though the memory device page programmer 113 is illustrated as part of the memory sub-system controller 115, for some embodiments the memory device page programmer 113 can be implemented (at least in part) by a controller residing on the memory device (e.g., 130, 140), such as by the local media controller 135 of the memory device 130.

Figure 2:
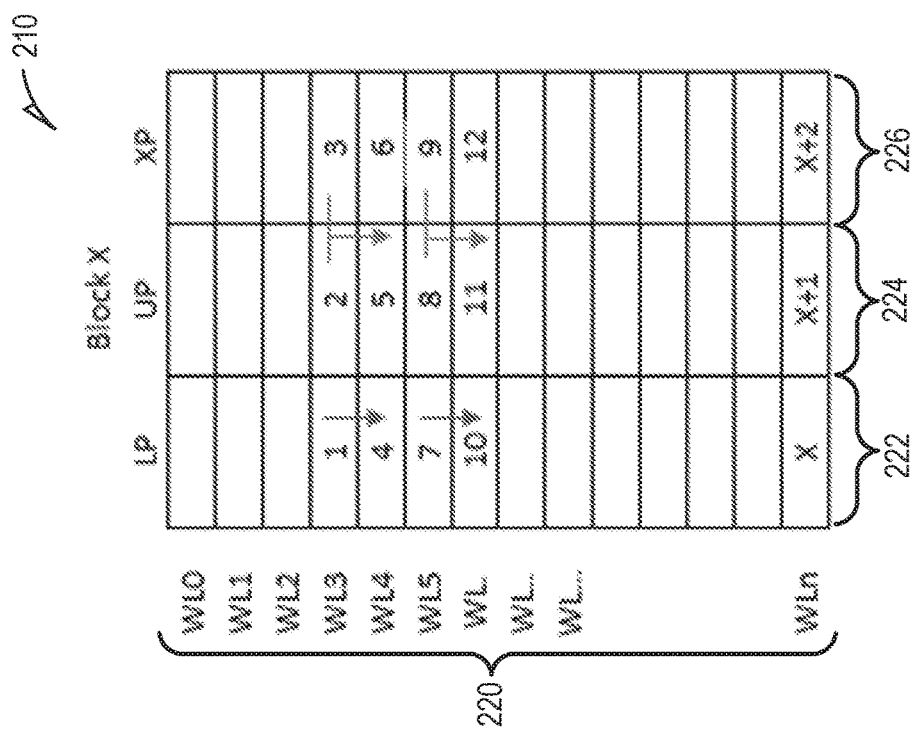
FIG. 2 presents tables illustrating example page program sequences for programming pages of blocks of a memory device, in accordance with some embodiments of the present disclosure.
Figure 2:
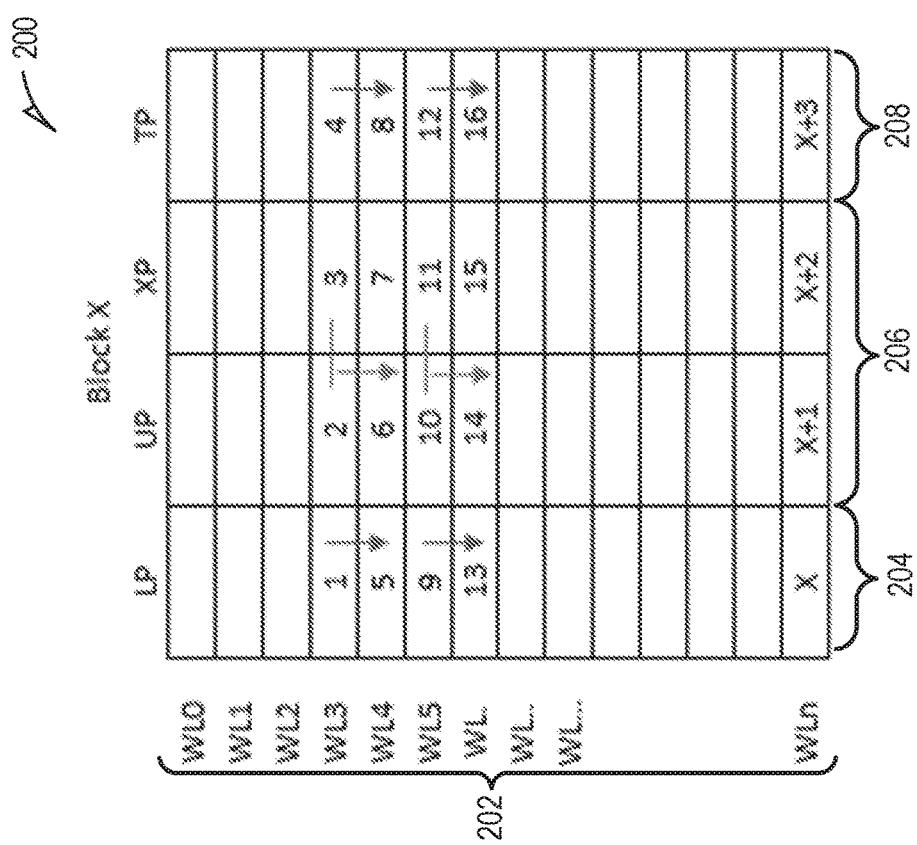

FIG. 2 presents tables 200, 210 illustrating example page program sequences for programming pages of blocks of a memory device, in accordance with some embodiments of the present disclosure. In particular, the table 200 illustrates an example page program sequence that can be used with a NAND-type memory device having QLC memory cells. Accordingly, the table 200 represents a block of a memory device, where the block comprises wordlines 202 ranging from WL0 to WLn, with each of the wordlines 200 comprising a LP page, a UP page, an XP page, and a TP page. In contrast, the table 210 illustrates an example page program sequence that can be used with a NAND-type memory device having TLC memory cells. Accordingly, the table 210 represents another block X of a memory device, where the block comprises wordlines 220 ranging from WL0 to WLn, with each of the wordlines 220 comprising a LP page, a UP page, and a TP page. As described herein, illustrated example page program sequences can be ones implemented by way of a memory sub-system controller (e.g., 115) or a local media controller (e.g., 135).

For the example page program sequence illustrated by the table 200, a first set of page types (204) can comprise a LP page, a second set of page types (206) can comprise UP and XP page types, and a third set of page types (208) can comprise a TP page. According to some embodiments, the example page program sequence can comprise: program one or more wordlines 202 of the block X with respect to LP pages (pages of the first set of page types 204); once LP pages of all wordlines 202 are programmed with data (e.g., host data), program one or more wordlines 202 of the block X with respect to UP and XP pages (pages of the second set of page types 206); and once UP and XP pages of all wordlines 202 are programmed with data (e.g., host data), program one or more wordlines 202 of the block X with respect to TP pages (pages of the third set of page types 208). As illustrated by the table 200, with respect to programming LP pages (pages of the first set of page types 204) of each of the wordlines 202, the LP pages of each wordline can programmed in sequence, starting from the LP page of wordline WL0 and ending with the LP page of wordline WLn. This is similarly illustrated with respect to programming TP pages (pages of the third set of page types 208). As also illustrated by the table 200, with respect to programming UP and XP pages (pages of the second set of page types 206) of each of the wordlines 202, the UP and XP pages (e.g., pages 2 and 3) of a given wordline (e.g., WL3) are programmed prior to the UP and XP pages (e.g., page 6 and 7) of the next wordline (e.g., WL4) being programmed.

For the example page program sequence illustrated by the table 210, a first set of page types (222) can comprise a LP page type, a second set of page types (224) can comprise a UP page type, and a third set of page types (226) can comprise a TP page type. According to some embodiments, the example page program sequence can comprise: program one or more wordlines 210 of the block X with respect to LP pages (pages of the first set of page types 222); once LP pages of all wordlines 220 are programmed with data (e.g., host data), program one or more wordlines 220 of the block X with respect to UP pages (pages of the second set of page types 224); and once UP pages of all wordlines 220 are programmed with data (e.g., host data), program one or more wordlines 220 of the block X with respect to TP pages (pages of the third set of page types 226). As illustrated by the table 210, with respect to programming LP pages (pages of the first set of page types 222) of each of the wordlines 220, the LP pages of each wordline can programmed in sequence, starting from the LP page of wordline WL0 and ending with the LP page of wordline WLn. This is similarly illustrated with respect to programming UP pages, (pages of the second set of page types 224) and TP pages (pages of the third set of page types 226).

Figure 3:
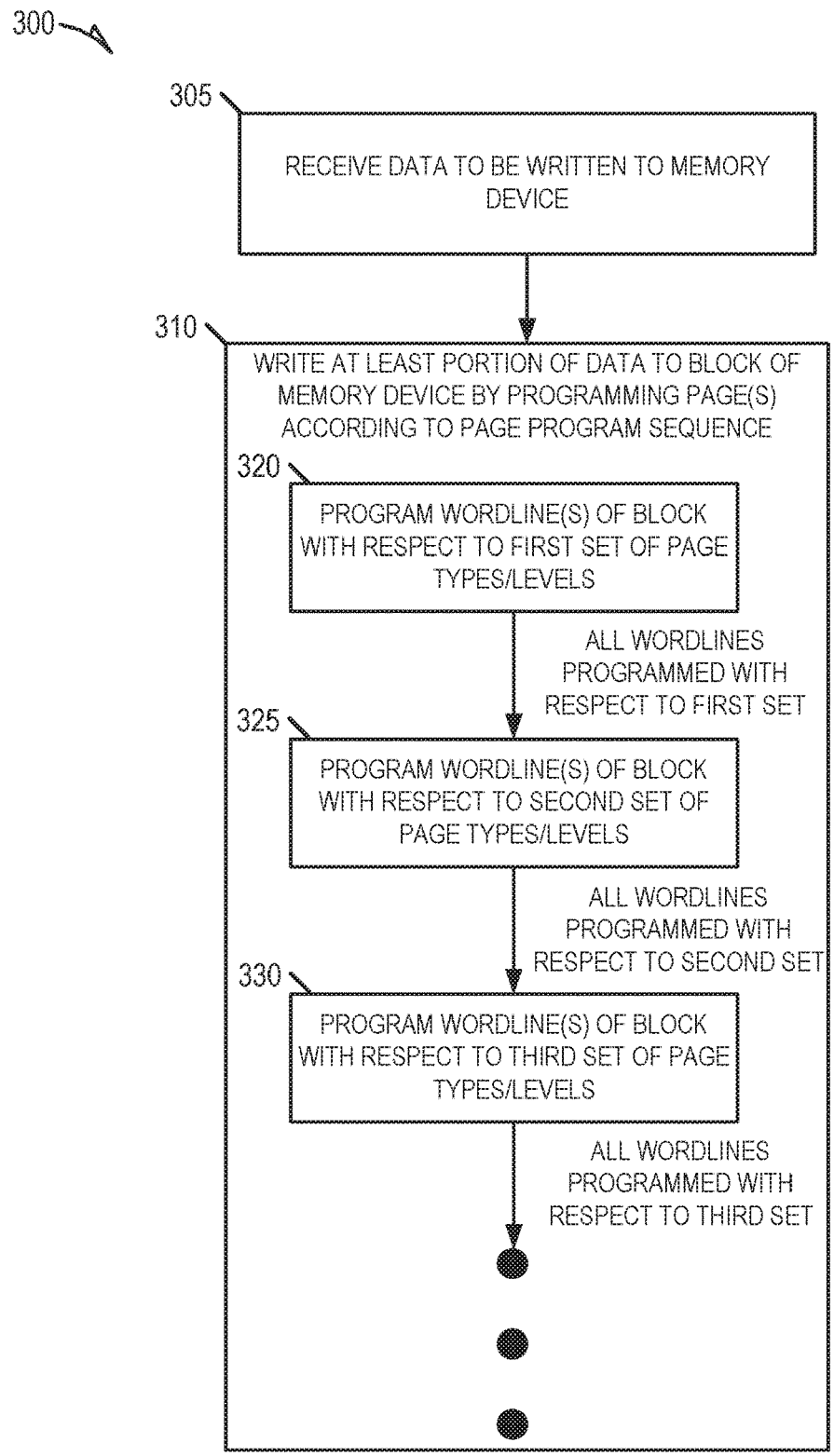
FIGS. 3 and 4 are flow diagrams of example methods for programming pages of a block of a memory device using a page program sequence, in accordance with some embodiments of the present disclosure.
Figure 4:
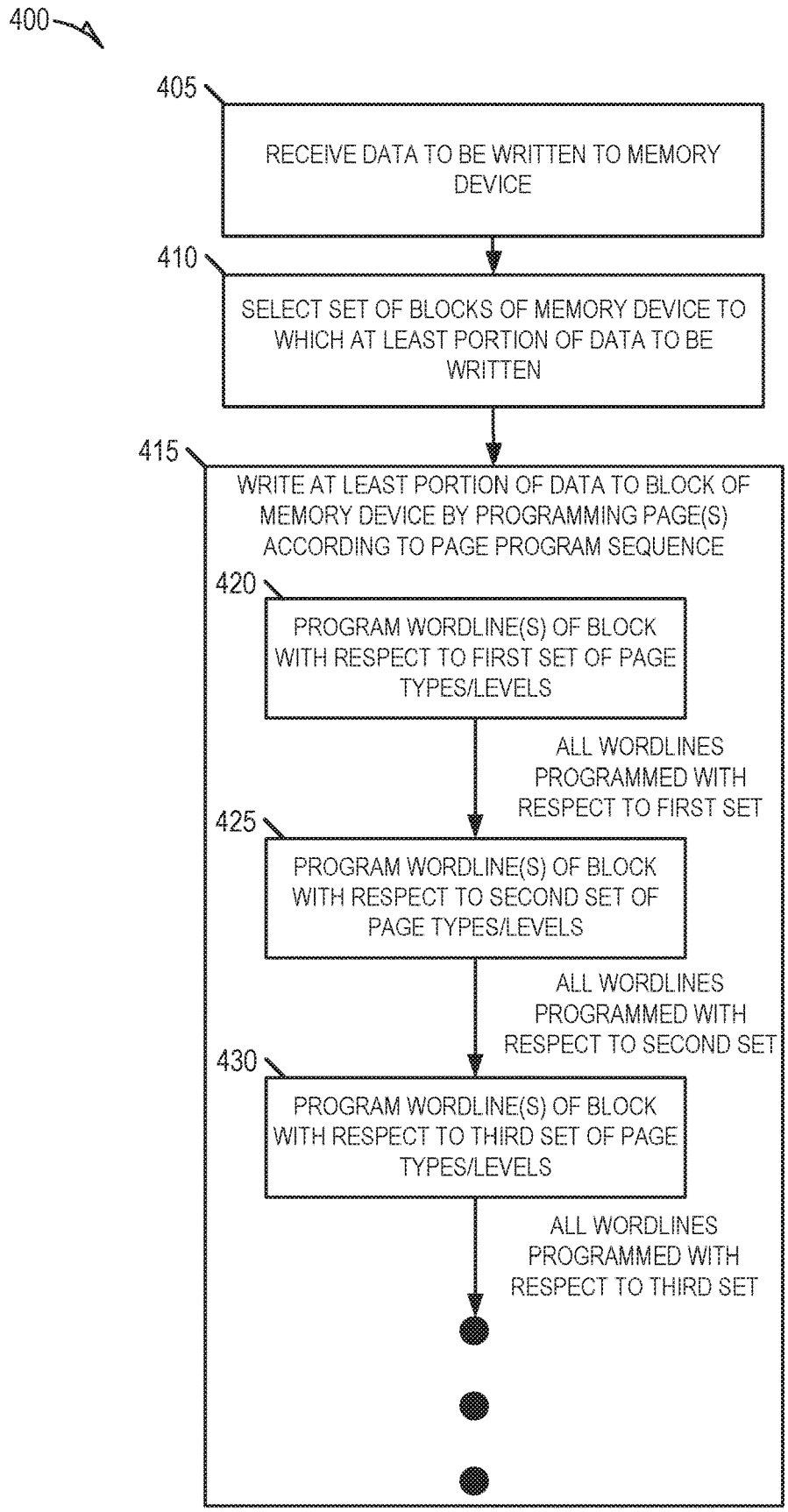

FIGS. 3 and 4 are flow diagrams of example methods for programming pages of a block of a memory device using a page program sequence, in accordance with some embodiments of the present disclosure. The methods 300, 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, at least one of the methods 300, 400 is performed by the memory sub-system controller 115 of FIG. 1 based on the memory device page programmer 113. Additionally, or alternatively, for some embodiments, at least one of the methods 300, 400 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to the method 300 of FIG. 3, at operation 305, a processing device (e.g., the processor 117 of the memory sub-system controller 115) receives data to be written to a memory device (e.g., 130). For some embodiments, the data received is host data from a host system (e.g., 120) that is requesting a memory sub-system (e.g., 110) to write the host data to the memory device (e.g., 130) for storage.

At operation 310, the processing device (e.g., 117) writes (or causes the writing of) at least a portion of the data to a particular block of the memory device (e.g., 130) by programming the particular block with the portion of the data according to a page program sequence of some of the embodiments described herein. The particular block can comprise a plurality of wordlines and a plurality of page types (or a plurality of page levels). For instance, for a NAND-type memory device having QLC memory cells, the plurality of page types can comprise LP, UP, XP, and TP page types. For a NAND-type memory device having TLC memory cells, the plurality of page types can comprise LP, UP, and TP page types. As described herein, each wordline in the plurality of wordlines can comprise a plurality of pages that each represents a different page type in the plurality of page types (or different page level in the plurality of page levels).

In FIG. 3, the page program sequence comprises: at operation 320, programming one or more wordlines, in the plurality of wordlines, with respect to a first set of page types from the plurality of page types (or a first set of page levels from the plurality of page levels); and after all wordlines for the first set of page types have been programmed, at operation 325, programming one or more wordlines, in the plurality of wordlines, with respect to a second set of page types from the plurality of page types (a second set of page levels from the plurality of page levels). As also shown, the page program sequence further comprises, after all wordlines for the second set of page types have been programmed, at operation 330, programming one or more wordlines, in the plurality of wordlines, with respect to a third set of page types from the plurality of page types (a third set of page levels from the plurality of page levels). The page program sequence can continue in this way (as additional data is written to the particular block) until all wordlines of all the sets of page types within the particular block are written to in this manner.

Depending on the embodiment, the first set of page types can comprise a lower page (LP) type. The second set of page types can comprise an upper page (UP) type, or an upper page (UP) type and an extra page (XP) type. The third set of page types can comprise a top page (TP) type. Alternatively, the first set of page levels can comprise a first page level. The second set of page levels can comprise a second page level, or a second page level and a third page level. The third set of page levels can comprise a fourth page level.

Referring now to the method 400 of FIG. 4, operation 405 can be similar to the operation 305 described above with respect to the method 300 of FIG. 3. At operation 410, the processing device (e.g., 117) selects a set of blocks of the memory device (e.g., 130) to which at least a portion of data is to be written.

At operation 415, the processing device (e.g., 117) writes (or causes the writing of) at least a portion of the data to a particular block (of the set of blocked selected by operation 410) by programming the particular block with the portion of the data according to a page program sequence of some of the embodiments described herein. For some embodiments, operations 420, 425, 430 (of operation 415) are respectively similar to the operation 320, 325, and 330 (of operation 310) described above with respect to the method 300 of FIG. 3.

Figure 5A:
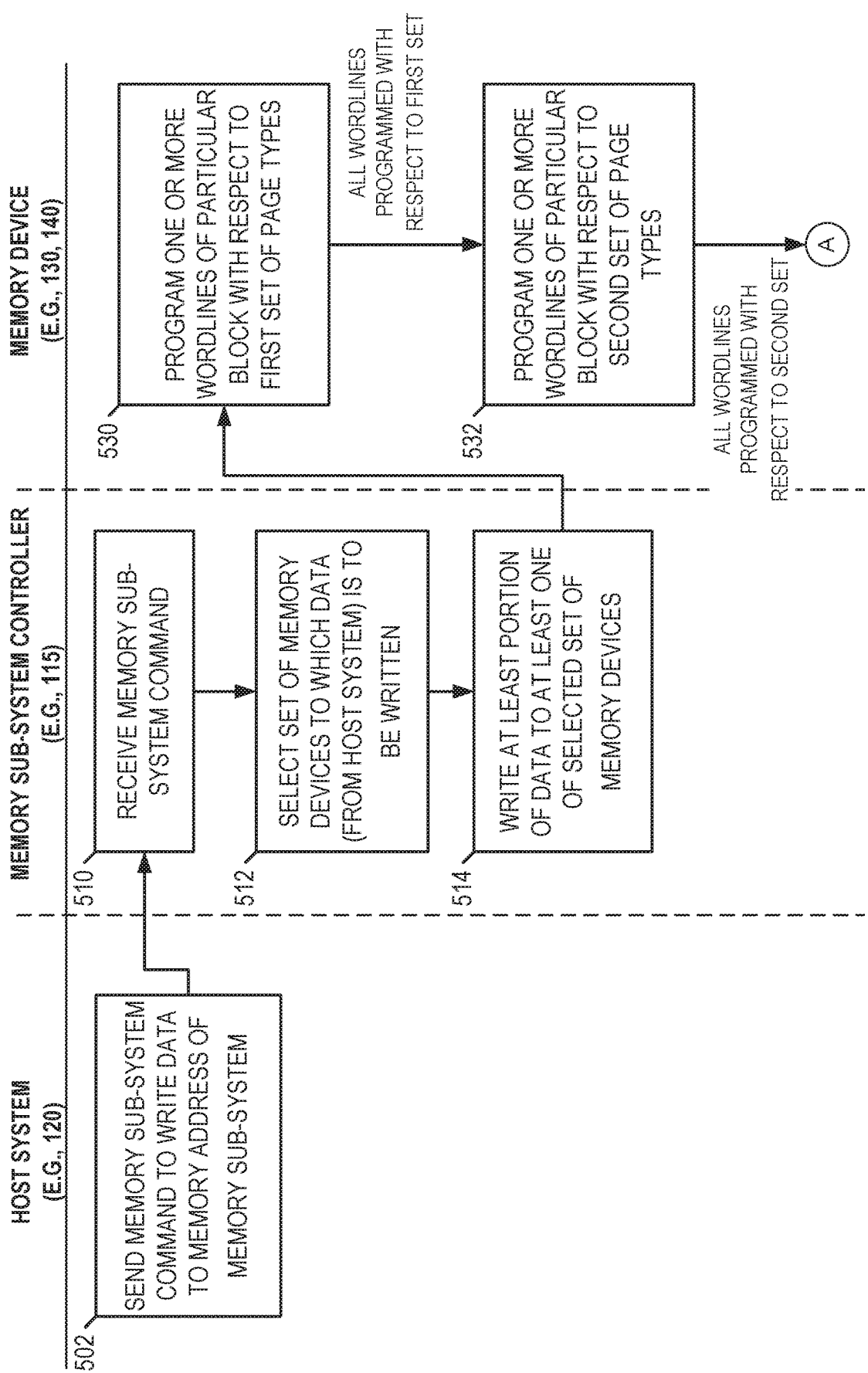
FIGS. 5A and 5B provide an interaction diagram illustrating interactions between components of a computing environment in the context of some embodiments in which a method for programming pages of a block of a memory device using a page program sequence as described herein is performed.
Figure 5B:
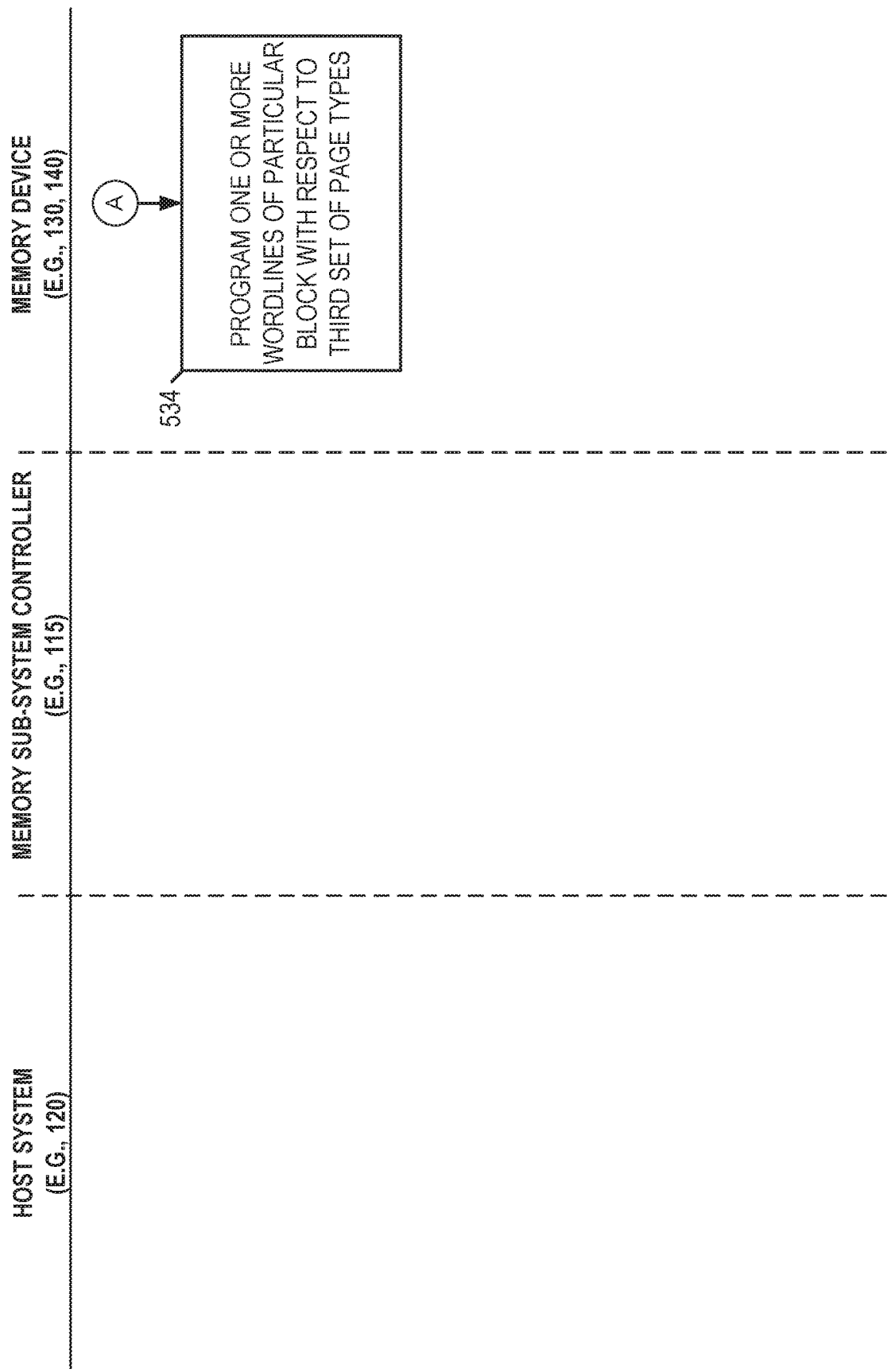

FIGS. 5A and 5B provide an interaction diagram illustrating interactions between components of the computing environment 100 in the context of some embodiments in which a method for programming pages of a block of a memory device using a page program sequence as described herein is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a host system (e.g., 120), a memory sub-system controller (e.g., 115), a memory device (e.g., 130, 140), or some combination thereof. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. In the context of the example illustrated in FIGS. 5A and 5B, the host system can include the host system 120, the memory sub-system controller can include the memory sub-system controller 115, and the memory device can include the memory device 130 or 140.

As shown in FIG. 5A, at operation 502, the host system 120 sends a memory sub-system command to the memory sub-system 110 to write data (e.g., host data) to a memory address of the memory sub-system 110. At operation 510, the memory sub-system controller 115 receives the memory sub-system command and, at operation 512, the memory sub-system controller 115 (based on the memory address provided with the memory sub-system command) selects a set of memory devices to which the data (e.g., host data) is to be written. At operation 514, the memory sub-system controller 115 writes at least a portion of the data (e.g., host data) to a memory device (e.g., 130) of the selected set of memory devices (e.g., 130, 140).

At operation 530, based on operation 514, the memory sub-system controller 115 can cause the memory device (e.g., 130) to program one or more wordlines of the particular block with respect to a first set of page types (e.g., LP pages). At operation 532, after all wordlines of the particular block are programmed with respect to the first set of page types (e.g., LP pages), the memory sub-system controller 115 can cause the memory device (e.g., 130) to program one or more wordlines of the particular block with respect to a second set of page types (e.g., UP and XP pages). Referring now to FIG. 5B, at operation 534, the memory sub-system controller 115 can cause the memory device (e.g., 130) to program one or more wordlines of the particular block with respect to a third set of page types (e.g., TP pages).

Figure 6:
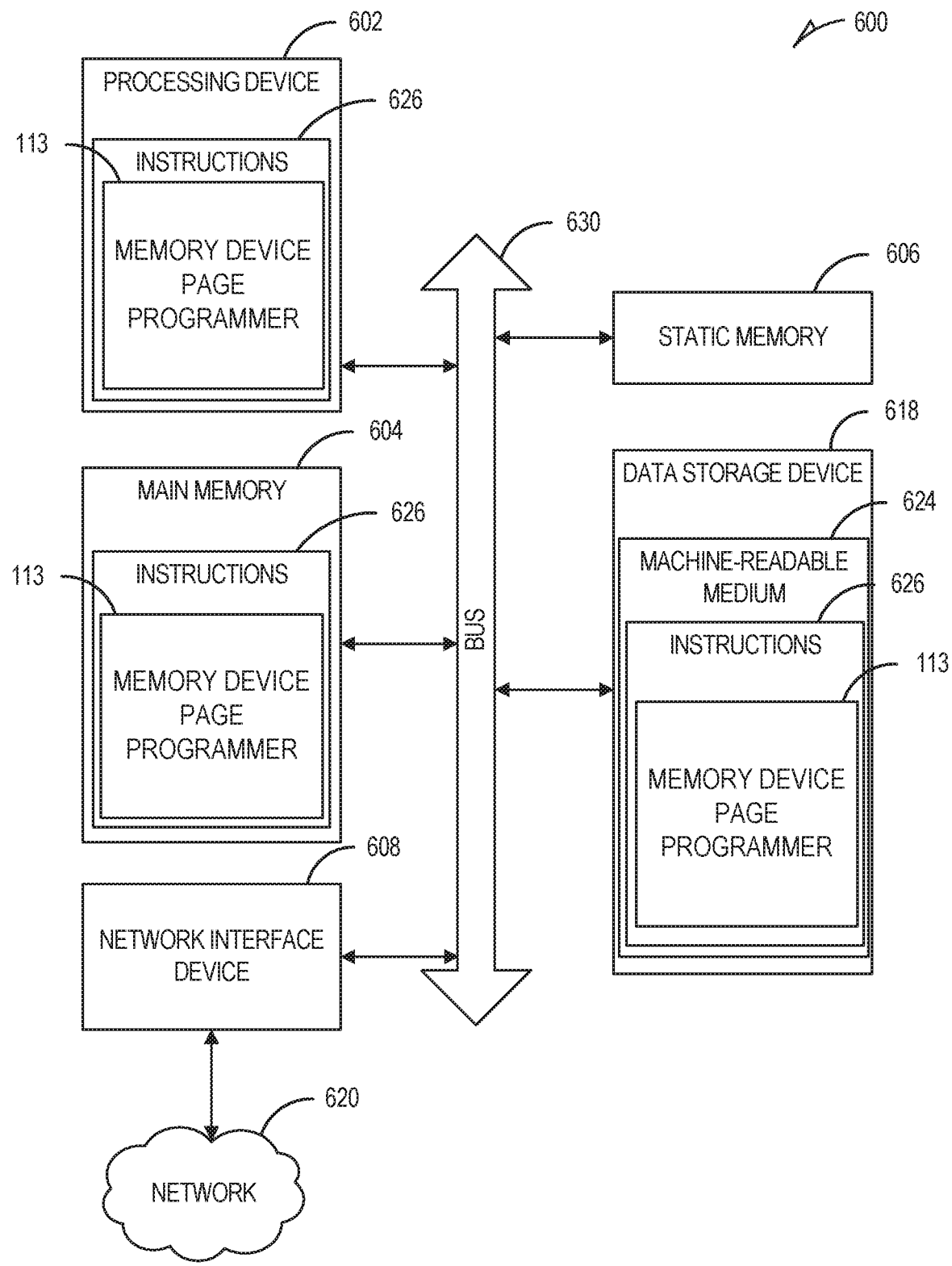
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage device 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage device 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage device 618, and/or main memory 604 can correspond to the memory sub-system 110 of FIG. 1.

In one embodiment, the instructions 626 include instructions to implement functionality corresponding to programming pages of a block of a memory device using a page program sequence as described herein (e.g., the memory device page programmer 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a set of memory devices; and
   a processing device, operatively coupled to the set of memory devices, configured to perform operations comprising:
      receiving data to be written to the set of memory devices;

selecting a set of blocks of a particular memory device of the set of memory devices, a particular block of the set of blocks comprising a plurality of wordlines and a plurality of page types; and writing at least a portion of the data to the particular block by programming the particular block with the portion of the data according to a page program sequence, the page program sequence comprising:

program one or more wordlines, in the plurality of wordlines of the particular block, with respect to a first set of page types from the plurality of page types; and after all wordlines for the first set of page types have been programmed in the plurality of wordlines of the particular block, program one or more wordlines, in the plurality of wordlines of the particular block, with respect to a second set of page types from the plurality of page types.

2. The system of claim 1, wherein the first set of page types comprises a lower page (LP) type.

3. The system of claim 1, wherein the second set of page types comprises an upper page (UP) type and an extra page (XP) type.

4. The system of claim 3, wherein the page program sequence further comprises:

after all wordlines for the second set of page types have been programmed in the plurality of wordlines of the particular block, program one or more wordlines, in the plurality of wordlines of the particular block, with respect to a third set of page types from the plurality of page types.

5. The system of claim 4, wherein the third set of page types comprises a top page (TP) type.

6. The system of claim 1, wherein the first set of page types are used as a write cache.

7. The system of claim 6, wherein the second set of page types is used as a secondary write cache.

8. The system of claim 1, wherein the particular memory device comprises a negative-and (NAND)-type memory device.

9. The system of claim 8, wherein the negative-and (NAND)-type memory device is implemented using one or more replacement gates (RGs).

10. The system of claim 1, wherein each wordline in the plurality of wordlines comprises a plurality of pages that each represents a different page type in the plurality of page types.

11. A method comprising:

receiving, from a host system, data to be written to a memory sub-system; and writing at least a portion of the data to a particular block of a particular memory device of the memory sub-system, the particular block comprising a plurality of wordlines and a plurality of page levels, and the writing comprising programming the particular block with the portion of the data according to a page program sequence, the page program sequence comprising:

program one or more wordlines, in the plurality of wordlines of the particular block, with respect to a first set of page levels from the plurality of page levels; and after all wordlines for the first set of page levels have been programmed in the plurality of wordlines of the particular block, program one or more wordlines, in the plurality of wordlines of the particular block, with respect to a second set of page levels from the plurality of page levels.

12. The method of claim 11, wherein the first set of page levels comprises a first page level of a memory cell.

13. The method of claim 11, wherein the second set of page levels comprises a second page level and a third page level.

14. The method of claim 13, wherein the page program sequence further comprises:

after all wordlines for the second set of page levels have been programmed in the plurality of wordlines of the particular block, program one or more wordlines, in the plurality of wordlines of the particular block, with respect to a third set of page levels from the plurality of page levels.

15. The method of claim 14, wherein the third set of page levels comprises a fourth page level.

16. The method of claim 11, wherein the first set of page levels are used as a write cache.

17. The method of claim 16, wherein the second set of page levels are used as a secondary write cache.

18. The method of claim 11, wherein the particular memory device comprises a NAND-type memory device that is implemented using one or more replacement gates (RGs).

19. The method of claim 11, wherein each wordline in the plurality of wordlines comprises a plurality of pages that each represents a different page level in the plurality of page levels.

20. A non-transitory computer-readable storage medium comprising instructions that, when executed by a processing device, cause the processing device to perform operations comprising:

receiving data to be written to a memory device; and writing at least a portion of the data to a particular block of the memory device by programming the particular block with the portion of the data according to a page program sequence, the particular block comprising a plurality of wordlines and a plurality of page types, and the page program sequence comprising:

program one or more wordlines, in the plurality of wordlines of the particular block, with respect to a first set of page types from the plurality of page types; and after all wordlines for the first set of page types have been programmed in the plurality of wordlines of the particular block, program one or more wordlines, in the plurality of wordlines of the particular block, with respect to a second set of page types from the plurality of page types.

* * * * *